US006259132B1

(12) United States Patent
Pio (10) Patent No.: US 6,259,132 B1
(45) Date of Patent: Jul. 10, 2001

(54) ARRAY OF ELECTRICALLY PROGRAMMABLE NON-VOLATILE SEMICONDUCTOR MEMORY CELLS COMPRISING ROM MEMORY CELLS

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/109,487

(22) Filed: Jul. 2, 1998

(30) Foreign Application Priority Data

Jul. 8, 1997 (EP) ................................. 97830342

(51) Int. Cl.[7] ................................. H01L 29/788
(52) U.S. Cl. .................. 257/315; 257/314; 257/315; 257/316; 257/317; 257/318; 257/319; 257/320; 257/321
(58) Field of Search ................... 257/315, 314, 257/316, 318, 320, 321, 390, 391

(56) References Cited

U.S. PATENT DOCUMENTS

| Re. 36,210 | * | 5/1999 | Santin | 365/185.19 |
|---|---|---|---|---|
| 5,021,999 | * | 6/1991 | Kohda et al. | 365/168 |
| 5,227,326 | | 7/1993 | Walker | 437/52 |
| 5,488,006 | | 1/1996 | Shirota | 437/43 |
| 5,600,171 | * | 2/1997 | Makihara et al. | 257/390 |
| 5,631,486 | * | 5/1997 | Hsu | 257/390 |
| 5,698,879 | * | 12/1997 | Aritome et al. | 257/315 |
| 5,894,146 | * | 4/1999 | Pio et al. | 257/319 |
| 5,990,512 | * | 11/1999 | Diorio et al. | 257/314 |
| 6,004,847 | * | 12/1999 | Clementi et al. | 438/258 |
| 6,144,078 | * | 11/2000 | Fournel | 257/390 |

OTHER PUBLICATIONS

European Search Report from European Patent Application 97830342.8. filed Jul. 8, 1997.

* cited by examiner

Primary Examiner—Matthew Smith
Assistant Examiner—G. Lee
(74) Attorney, Agent, or Firm—Wolf, Greenfield & Sacks, P.C.; James H. Morris; Theodore E. Galanthay

(57) ABSTRACT

Array of electrically programmable non-volatile memory cells, each cell comprising a stacked-gate MOS transistor having a lower gate electrode, an upper gate electrode coupled to a row of the array, a first electrode associated with a column of the array and a second electrode separated from the first electrode by a channel region underlying said lower gate electrode, the first electrode, the second electrode and the channel region being formed in a layer of semiconductor material of a first conductivity type and having a second conductivity type, comprising at least one ROM memory cell which identically to the electrically programmable non-volatile memory cells comprises a stacked-gate MOS transistor and is associated with a respective row and a respective column of the array, the ROM cell including means for allowing or not allowing the electrical separation between said respective column and the second electrode of the ROM cell, if the ROM cell must store a first logic state or, respectively, a second logic state.

43 Claims, 11 Drawing Sheets

ARRAY OF ELECTRICALLY PROGRAMMABLE NON-VOLATILE SEMICONDUCTOR MEMORY CELLS COMPRISING ROM MEMORY CELLS

BACKGROUND OF THE INVENTION

1. Field of the Invention

The present invention concerns an array of electrically programmable non-volatile semiconductor memory cells comprising ROM (Read Only Memory) memory cells.

2. Discussion of the Related Art

Generally, in semiconductor devices it is often necessary to store permanently some information, that can be necessary for operating the device or for identifying the same.

This is true in particular for electrically programmable non-volatile semiconductor memory devices, such as EPROM, Flash EEPROM and EEPROM memories. In such devices said information (e.g., for identifying the device) is stored in one or more rows of EPROM, Flash EEPROM or EEPROM memory cells, respectively, belonging to the array of memory cells of the device.

However, it is known that EPROM, Flash EEPROM and EEPROM memory cells include floating-gate MOS transistors, and the information is stored by means of charge trapped in the floating gate. The information might thus be lost for several reasons, in particular due to a loss of charge by the floating gates of the memory cells.

In order to permanently store the information, ROM memory cells are to be used. Conventionally, a ROM memory cell is formed by a MOS transistor, e.g. with an N-type channel, having N-type drain and source regions formed in a P-type substrate or well and spaced apart. The portion of P-type substrate or well between the source and drain regions forms a channel region, and a gate electrode is placed above the channel region with the interposition of a thin gate oxide layer.

Programming of a ROM memory cell is made during the manufacturing thereof, either by means of dedicated process steps or by means of a structure suitable for making the cell non-conductive. This can be made, for example, by implanting a dopant in the channel region, so as to vary the threshold voltage of the cell.

The interposition of ROM memory cells in an EPROM, Flash EEPROM or EEPROM memory device for storing information that might get lost is however disadvantageous under several respects.

Firstly, it is necessary to provide, in the normal manufacturing process flow for the EPROM, Flash EEPROM or EEPROM memories, additional process steps and photolithographic masks dedicated for forming the ROM cells. This causes an increase in the manufacturing costs.

Secondly, the ROM memory cells cannot be integrated in the same array of EPROM, Flash EEPROM or EEPROM memory cells, because having a different layout they would cause irregularities. It is thus necessary to provide suitable small arrays of ROM memory cells. This however causes an increase in the overall area of the memory device, and thus an increase of the manufacturing costs.

Thirdly, addressing and sensing of the ROM cells require dedicated circuits normally different from those already provided for addressing and sensing EPROM, Flash EEPROM or EEPROM memory cells, and this has the consequence of an increase in the overall area of the memory device and in the complexity of the design.

All this makes it disadvantageous to provide, in an electrically programmable non-volatile memory device, a small array of ROM cells for permanently storing identifying information.

SUMMARY OF THE INVENTION

In view of the state of the art described, it is an object of the present invention to provide an array of electrically programmable non-volatile memory cells integrating at the same time ROM memory cells, without additional costs due to dedicated process steps or an increase in the overall area, and allowing for using, for addressing and sensing the ROM cells, substantially the same addressing and sensing circuits already provided for the electrically programmable non-volatile memory cells.

According to the present invention, these and other objects are achieved by means of an array of electrically programmable non-volatile memory cells, each cell comprising a stacked-gate MOS transistor having a lower gate electrode, an upper gate electrode coupled to a row of the array, a first electrode associated with a column of the array and a second electrode separated from the first electrode by a channel region underlying said lower gate electrode, the first electrode, the second electrode and the channel region being formed in a layer of semiconductor material of a first conductivity type and having a second conductivity type, including at least one ROM memory cell which identically to the electrically programmable non-volatile memory cells comprises a stacked-gate MOS transistor and is associated with a respective row and a respective column of the array, the ROM cell comprising means for allowing or not allowing the electrical separation between said respective column and the second electrode of the ROM cell, if the ROM cell must store a first logic state or, respectively, a second logic state.

As a result of the present invention, it is possible to provide arrays of electrically programmable non-volatile memory cells also integrating ROM memory cells.

BRIEF DESCRIPTION OF THE DRAWINGS

The features and advantages of the present invention will be made apparent by the following detailed description of some embodiments thereof, illustrated as non-limiting examples in the annexed drawings, wherein.

DETAILED DESCRIPTION

Figure 1:
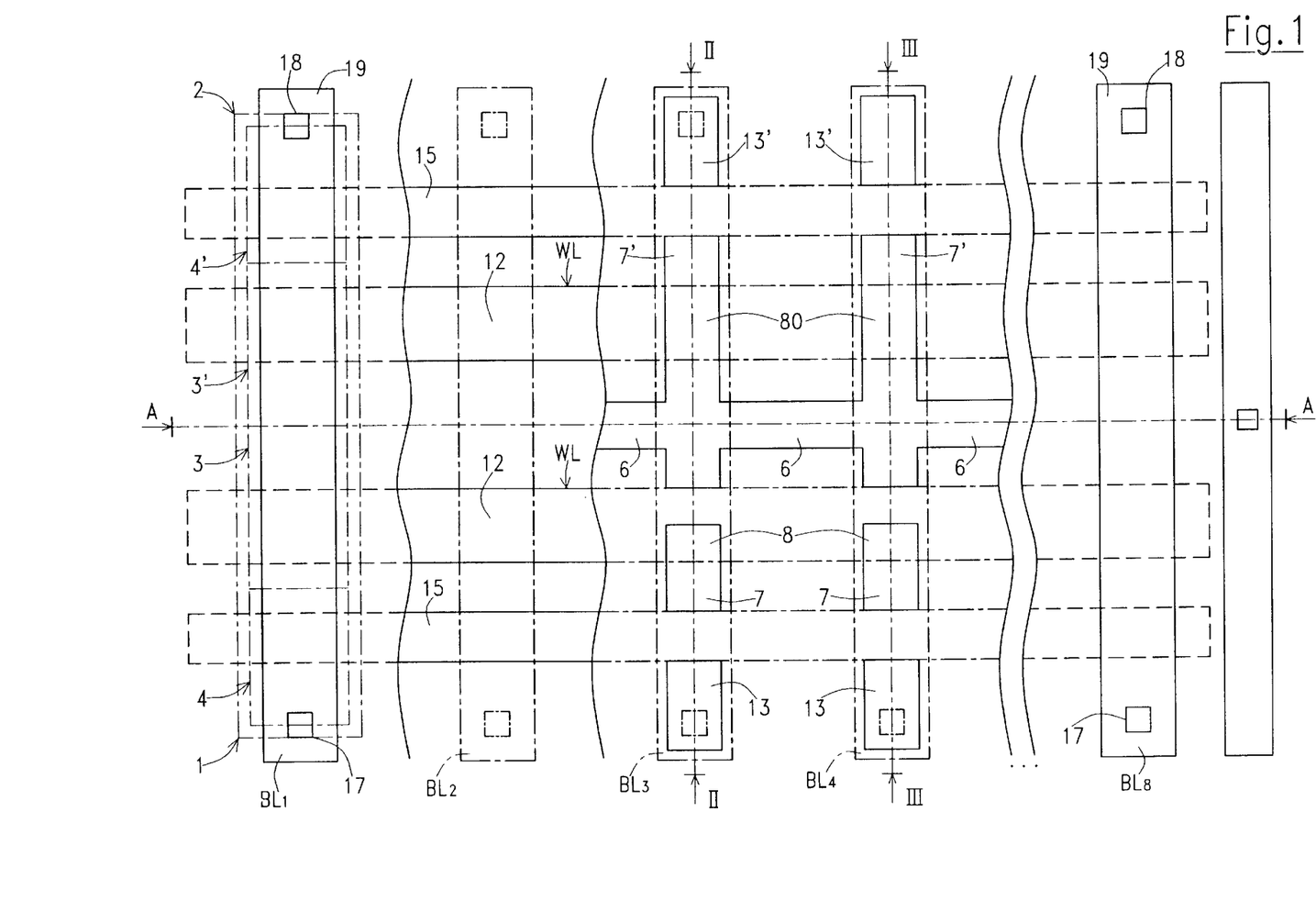
FIG. 1, referring to a first embodiment of the present invention, is a top-plan view of a portion of a memory array comprising EEPROM memory cells and ROM memory cells.

FIG. 1 shows in top-plan view and partially sectioned along several plates a portion of an array of memory cells comprising EEPROM semiconductor memory cells and ROM memory cells.

Conventionally, the semiconductor memory array comprises memory cells arranged in rows (word lines) WL and columns (bit lines) BL1, BL2, . . . ,BL8. The portion of array shown in FIG. 1 comprises eight ROM memory cells 2 and eight EEPROM memory cells 1 arranged symmetrically with respect to line A—A.

Figure 2:
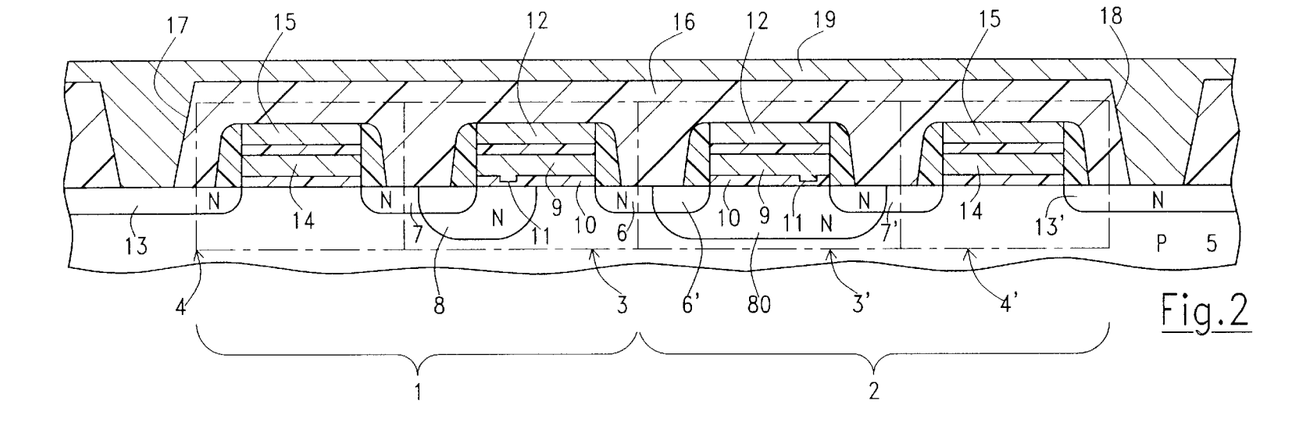
FIG. 2 is a sectional view along line II—II in FIG. 1.

Referring to FIG. 2, each EEPROM memory cell 1 comprises a stacked-gate MOSFET 3 and a selection transistor 4. For each stacked-gate MOSFET 3, in a P-type substrate or well 5 a source region 6 and a spaced-apart drain region 7 are implanted. A further N-type region 8 is implanted between the drain region 7 and a part of substrate or well 5 comprised between regions 6 and 7. The portion of substrate or well 5 comprised between regions 6 and 7 forms a channel region, and a lower gate electrode 9 is disposed above the channel and part of the drain region 7 with the interposition of a gate oxide layer 10 (typically of thickness comprised between 150 and 300 Angstroms), the latter having a thinner portion 11 (tunnel oxide of thickness between 70 and 120 Angstroms) at the further region 8 for allowing the passage of electrons by tunnel effect from the drain to the lower gate electrode and vice-versa, when information is stored in the memory cell 1.

An upper, control gate electrode 12 is insulatively disposed above the lower gate electrode 9, which is electrically floating.

In series to each MOSFET 3 a selection transistor 4 is connected having an N-type source region coincident with the drain region 7 of MOSFET 3, and an N-type drain region 13 formed in the P-type substrate or well 5. The region of the substrate or well 5 comprised between the drain region 13 and the source region 7 of transistor 4 forms a channel region, over which two polysilicon electrodes 14, 15 are disposed, one over the other with the interposition of different layers of oxide, for forming the gate of transistor 4.

Conventionally, for the selection transistors 4 the two polysilicon electrodes 14, 15 belong to respective lines formed from a first and a second levels of polysilicon, and said lines are electrically short-circuited in a region of the array not shown in FIG. 1.

The lower gate electrode 9 of MOSFETs 3 of the cells 1 is formed by definition of the first level of polysilicon, while the upper, control gate electrode 12 of MOSFET 3 of the cells 1 is formed by a respective line formed from the second level of polysilicon, such a line forming a word line WL.

Each ROM memory cell 2 comprises, identically to the EEPROM cells 1, a stacked-gate MOSFET 3' and, in series thereto, a selection transistor 4'. The ROM memory cells 2 and the EEPROM memory cells 1 are in fact formed by means of the same process steps and have identical structure.

Differently from the EEPROM memory cell 1, a further N-type region 80 is implanted between the drain region 7' and the source region 6' of the stacked-gate MOSFET 3', with the function of short-circuiting regions 6' and 7'. Preferably, region 80 is formed by means of the same implant used to form region 8 for the EEPROM memory cells 1.

Over the whole surface of the memory array a dielectric layer 16 is then formed, in which openings 17 are formed at the drains 13 of the selection transistors 4 of the EEPROM cells 1.

Figure 3:
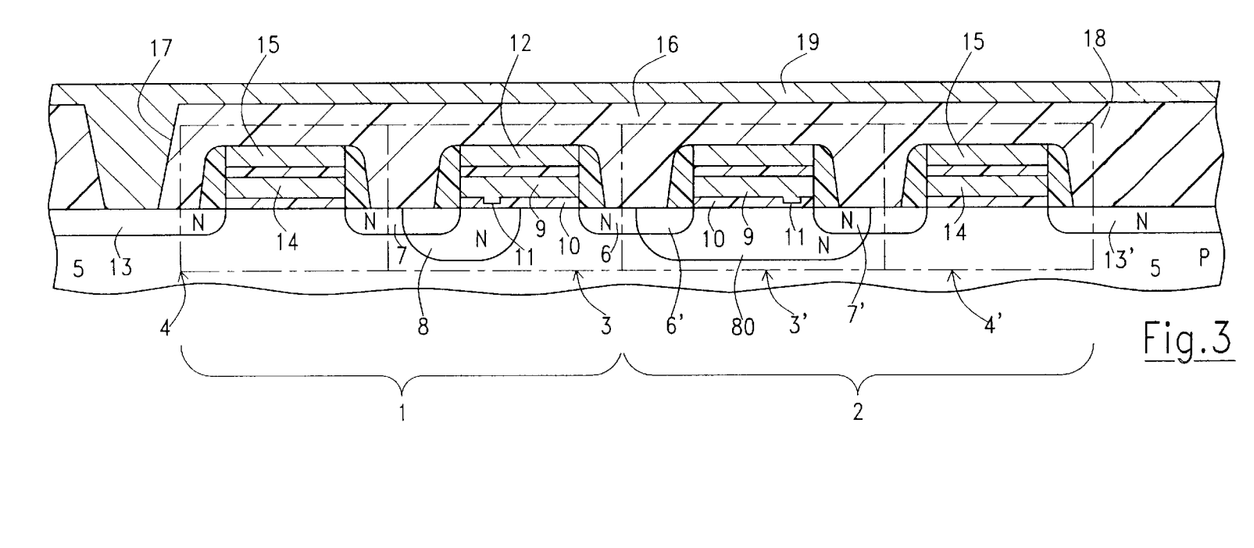
FIG. 3 is a sectional view along line III—III in FIG. 1.

In this first embodiment of the invention, if it is desired to program a "1" logic state into the ROM cell 2, then further openings 18 at the drains 13' of the selection transistors 4' of the ROM cells 2 (FIG. 2). When instead it is desired to program a "0" as shown in FIG. 3, no openings 18 will be formed. Then a level of metallization is deposited for forming metal lines 19 contacting through openings 17 and, where provided, openings 18 the drain diffusions 13 and 13' of the respective selection transistors 4 and 4'.

Lines 19 form the bit lines BL1, BL2, . . . ,BL8.

As known, reading of the EEPROM cell 1 is performed bringing the respective word line WL to a voltage VREAD of e.g. 2 V, and turning the respective selection transistor 4 on.

For reading a ROM cell 2, the respective word line WL can be brought to voltage VREAD or also kept at ground (it is not necessary to form the channel in the MOSFET 3', because region 80 is provided), and the respective selection transistor 4' is selected; if the contact between the respective bit line BL1, BL2, . . . ,BL8 and drain 13' of the selection transistor is provided, then the ROM cell 2 sink current from the bit line; if differently the contact is not provided, then the drain of the selection transistor 4' is disconnected from the bit line and no current will flow in the latter.

Figure 4:
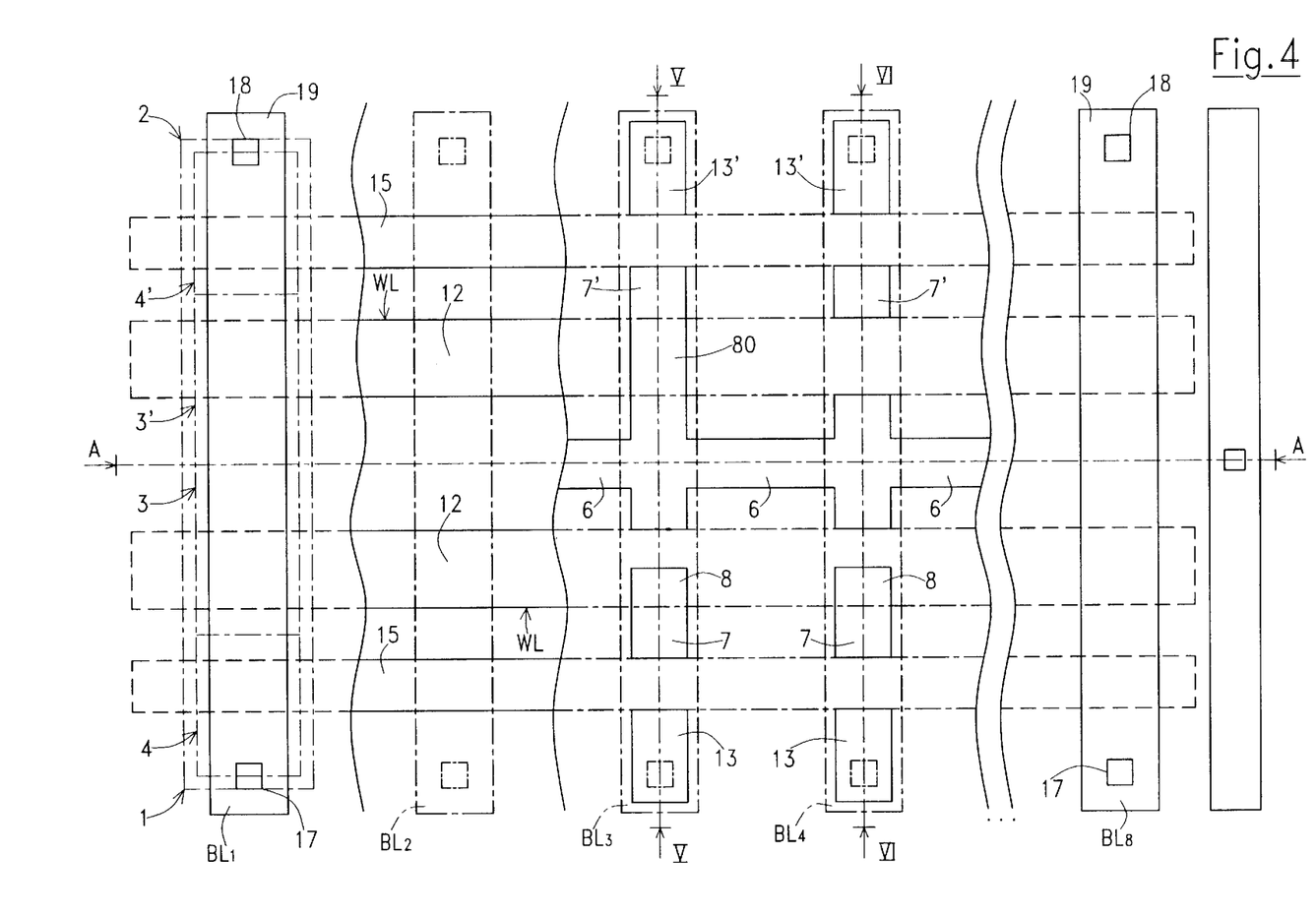
FIG. 4, referring to a second embodiment of the present invention, is a top-plan view of a portion of a memory array comprising again EEPROM memory cells and ROM memory cells.
Figure 5:
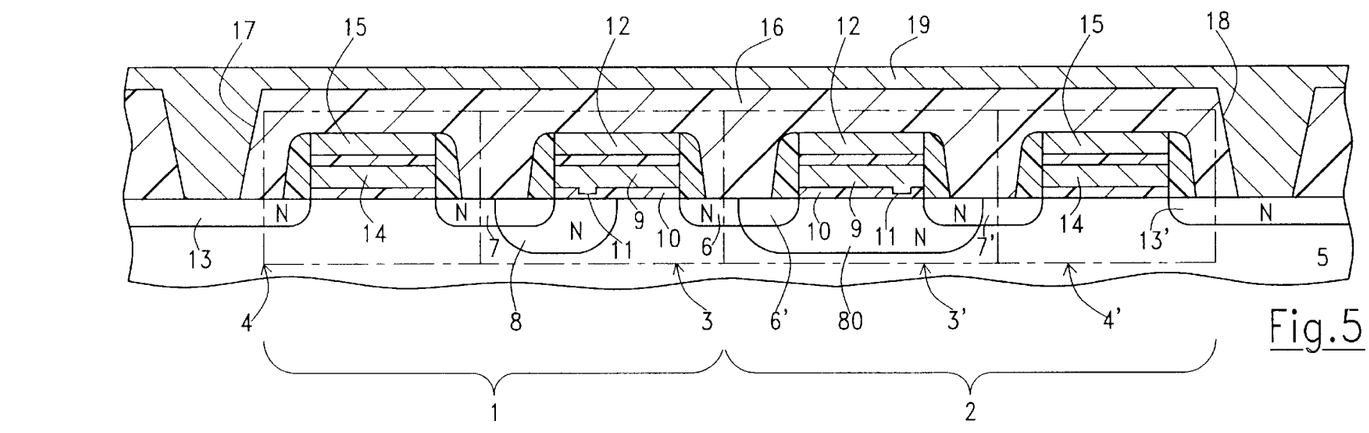
FIG. 5 is a sectional view along line V—V in FIG. 4.
Figure 6:
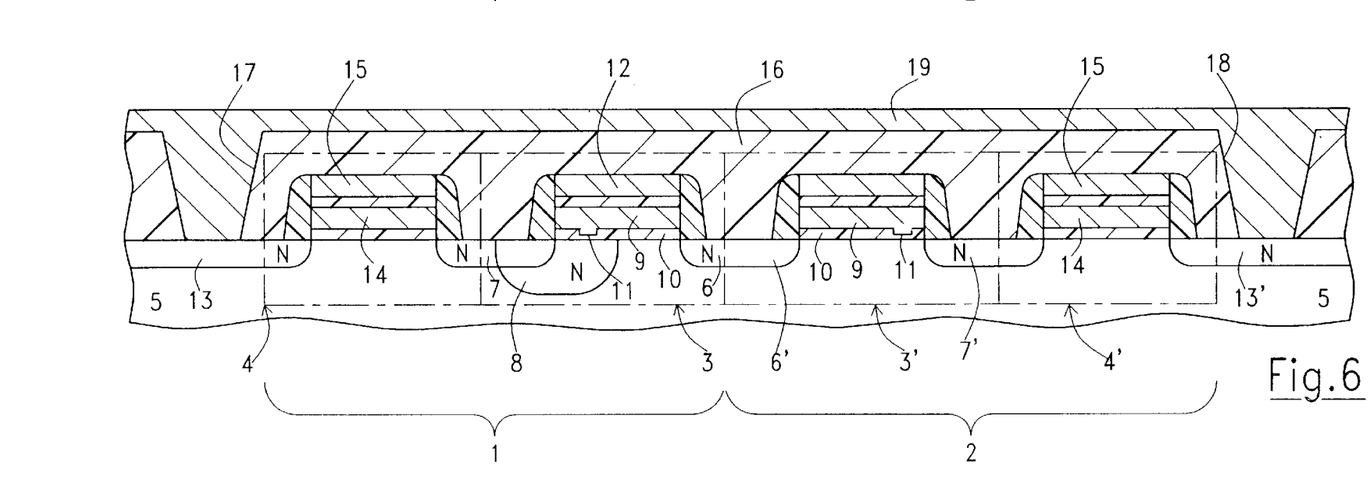
FIG. 6 is a sectional view along line VI—VI in FIG. 4.

Another embodiment of the present invention is shown in FIGS. 4–6. In this embodiment, differently from the previous one, apertres 17 and 18 in the dielectric layer 16 are always provided.

Programming of the ROM cell 2 is obtained by providing or not providing the N-type region 80 which short-circuits the source 6' and the drain 7' of MOSFET 3' of the ROM cell 2.

As shown in FIG. 5, when region 80 is provided, the source and drain regions 6' and 7' of MOSFET 3' are short-circuited, so that when transistor 4' is activated a current will flow through the bit line. In this case the ROM memory cell 2 stores a "1". If, differently, region 80 is not provided, as shown in FIG. 6, when the ROM cell 2 is read turning the selection transistor 4' on and keeping the respective word line at ground (or generally at a voltage lower than the threshold voltage of MOSFET 3'), no channel will form in MOSFET 3' so that no current flows in the ROM cell, and the latter is read as a "0".

It is important to underline that in this second embodiment, in order to read the ROM cells it is necessary to keep the respective word lines at a voltage lower than the threshold voltage of MOSFETs 3', otherwise also the ROM cells without the region 80 would become conductive.

An advantage of this embodiment with respect to the previous one is due to the impossibility of determining the code stored in the ROM cells 2 by way of a simple visual inspection of the memory array, because all the contacts to the ROM cell are present.

Figure 7:
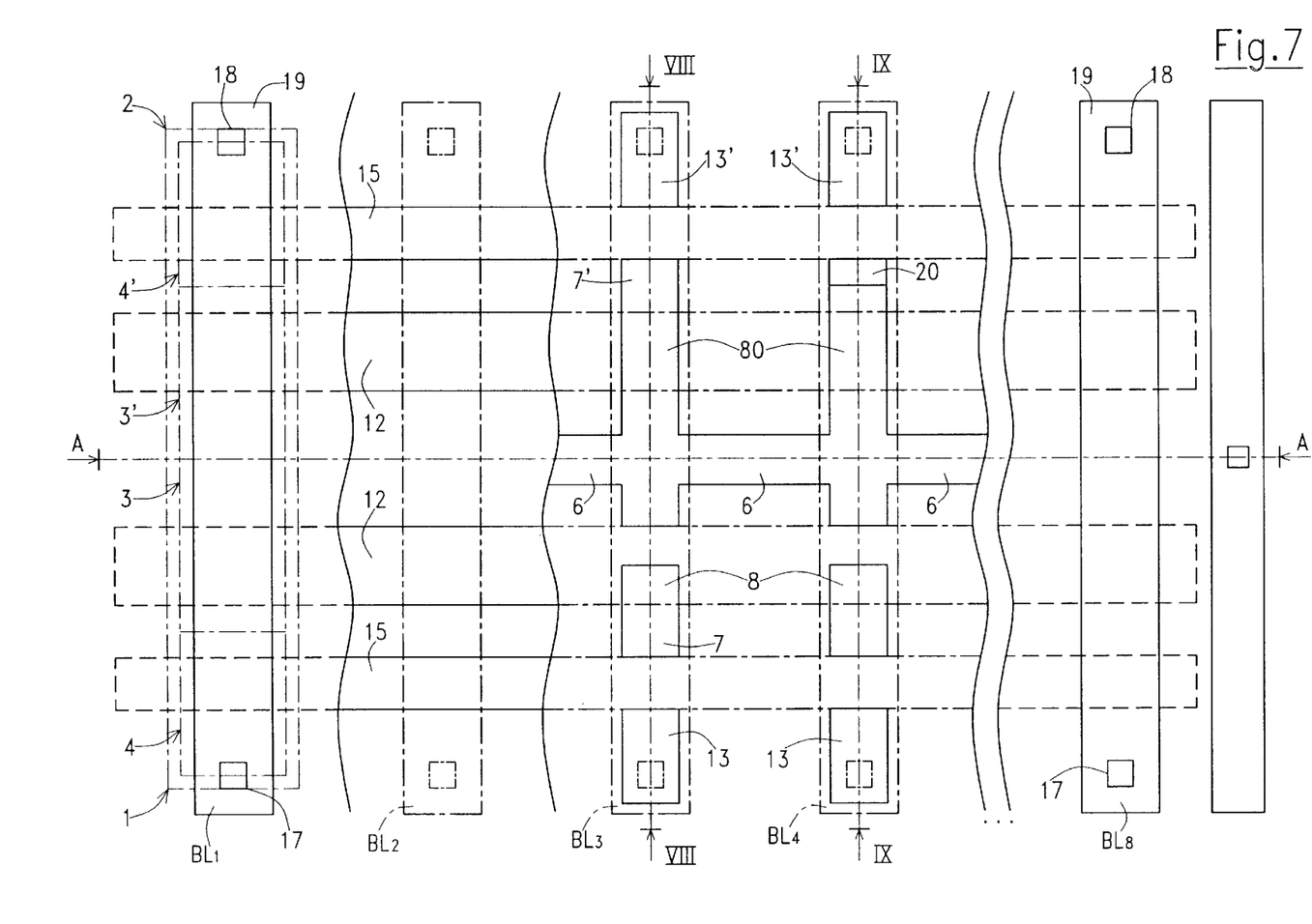
FIG. 7, referring to a third embodiment of the present invention, is a top-plan view of a portion of a memory array comprising again EEPROM memory cells and ROM memory cells.
Figure 8:
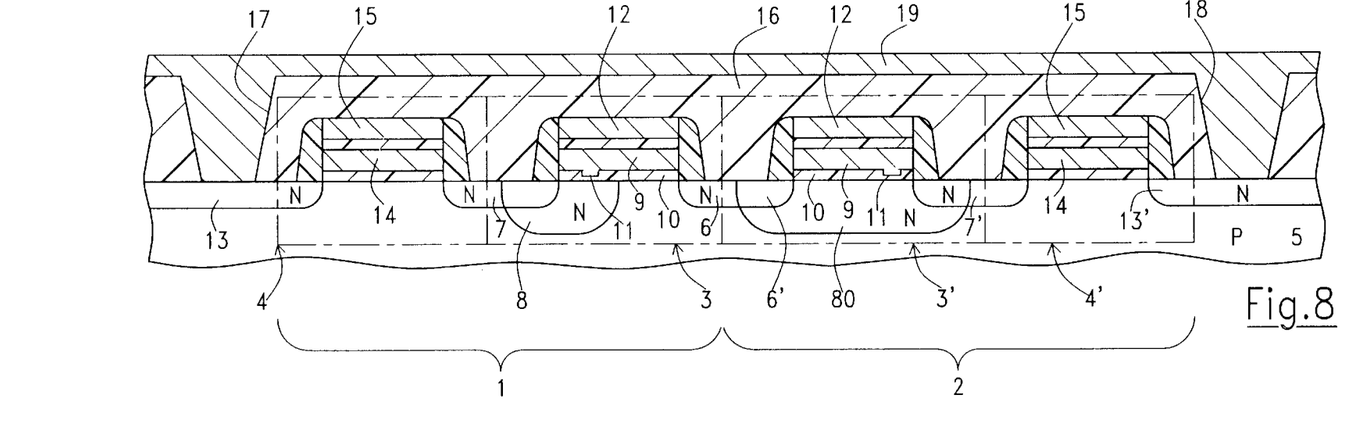
FIG. 8 is a sectional view along line VI—VI in FIG. 7.
Figure 9:
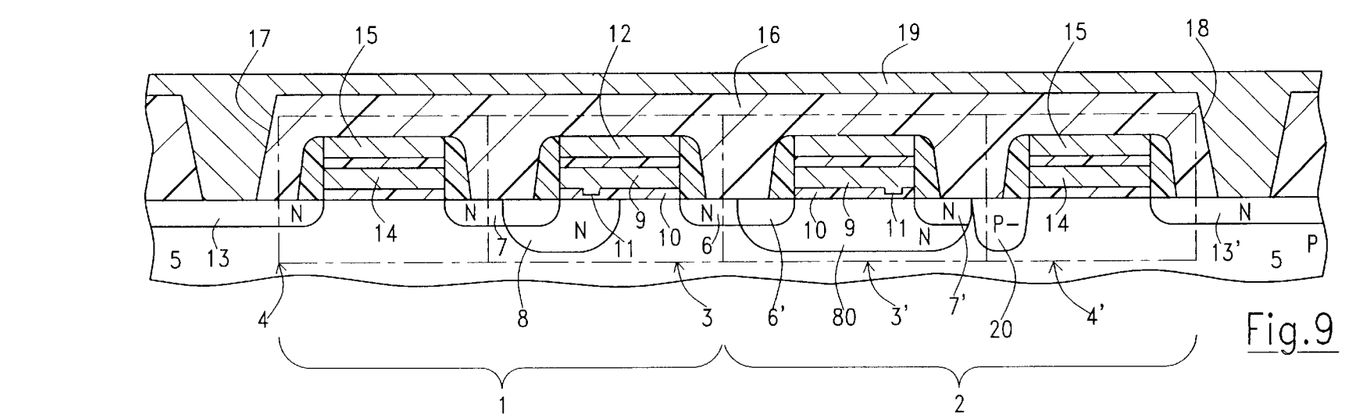
FIG. 9 is a sectional view along line IX—IX in FIG. 7.

Another embodiment of the present invention is shown in FIGS. 7–9.

As shown in FIG. 8, in this embodiment both the contact with a respective bit line, through a respective opening 18 in the dielectric layer 16, and the short-circuit between source 6' and drain 7' through a respective region 80 are always provided for each ROM cell 2.

When it is desired to store a state "0" in a ROM cell 2, the latter is formed such that in the drain region 7' of the respective stacked-gate MOSFET 3' (drain region which is normally formed by means of an LDD, Light Doped Drain implant) a lightly doped P-type is formed by implanting a P-type dopant with a concentration sufficient to compensate the N-type LDD implant used for forming the drain region 7' of the stacked-gate MOSFET 3'.

The P–region 20 forms an electrical separation region between the MOSFET 3' and the selection transistor 4' of the ROM cell 2. During reading of the ROM cell 2, no current will flow and the ROM cell 2 is thus non-conductive, independently of the voltage of the respective word line.

Figure 10:
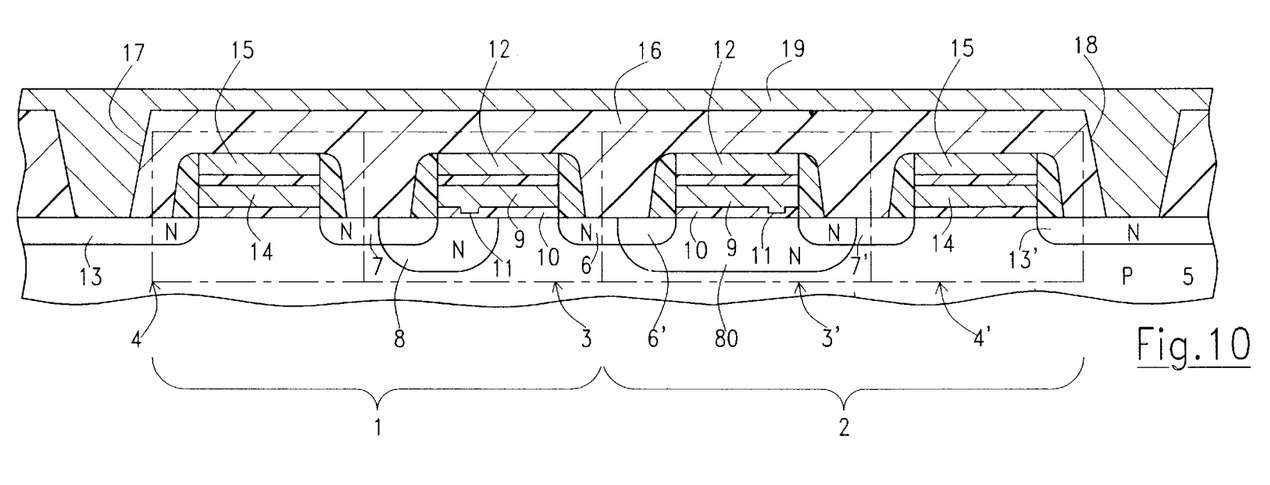
FIGS. 10 and 11 show sectional views similar to those shown in FIGS. 8 and 9, referring to an alternative embodiment of the third embodiment of the invention.
Figure 11:
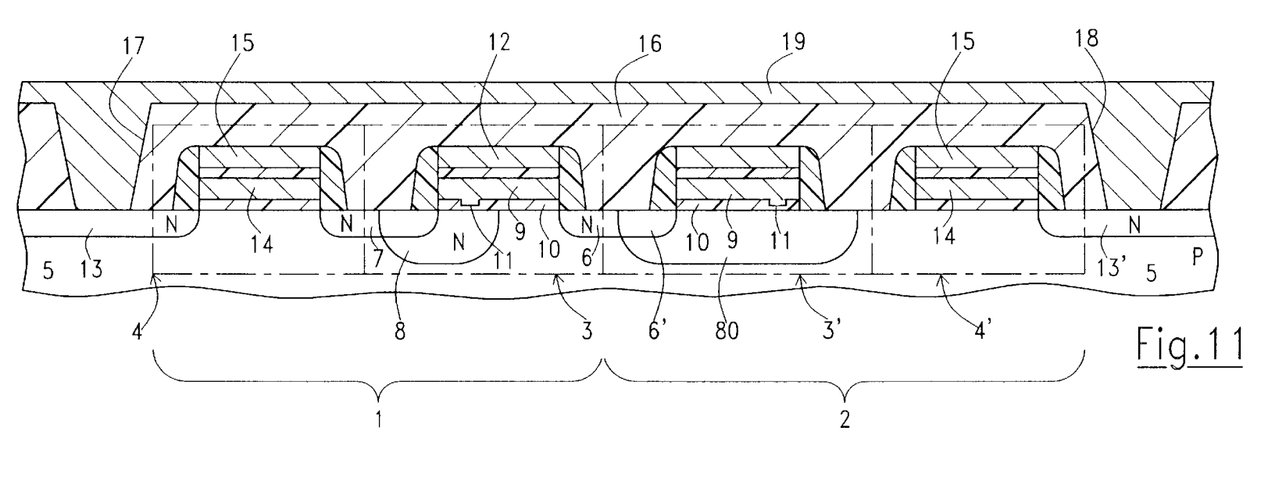

Alternatively, as shown in FIGS. 10 and 11, the same function of the P–region 20 which separates MOSFET 3' from the selection transistor 4' can be achieved selectively preventing (where it is desired to program a "0" state) the N-type LDD implant provided for forming the drain region 7' of MOSFET 3'. In this case region 20 is substituted by a portion of the substrate or well 5, and MOSFET 3' is electrically separated from the selection transistor 4' because the drain of the former is not linked to the channel of the latter (the selection transistor 4' not having the source diffusion).

Figure 12:
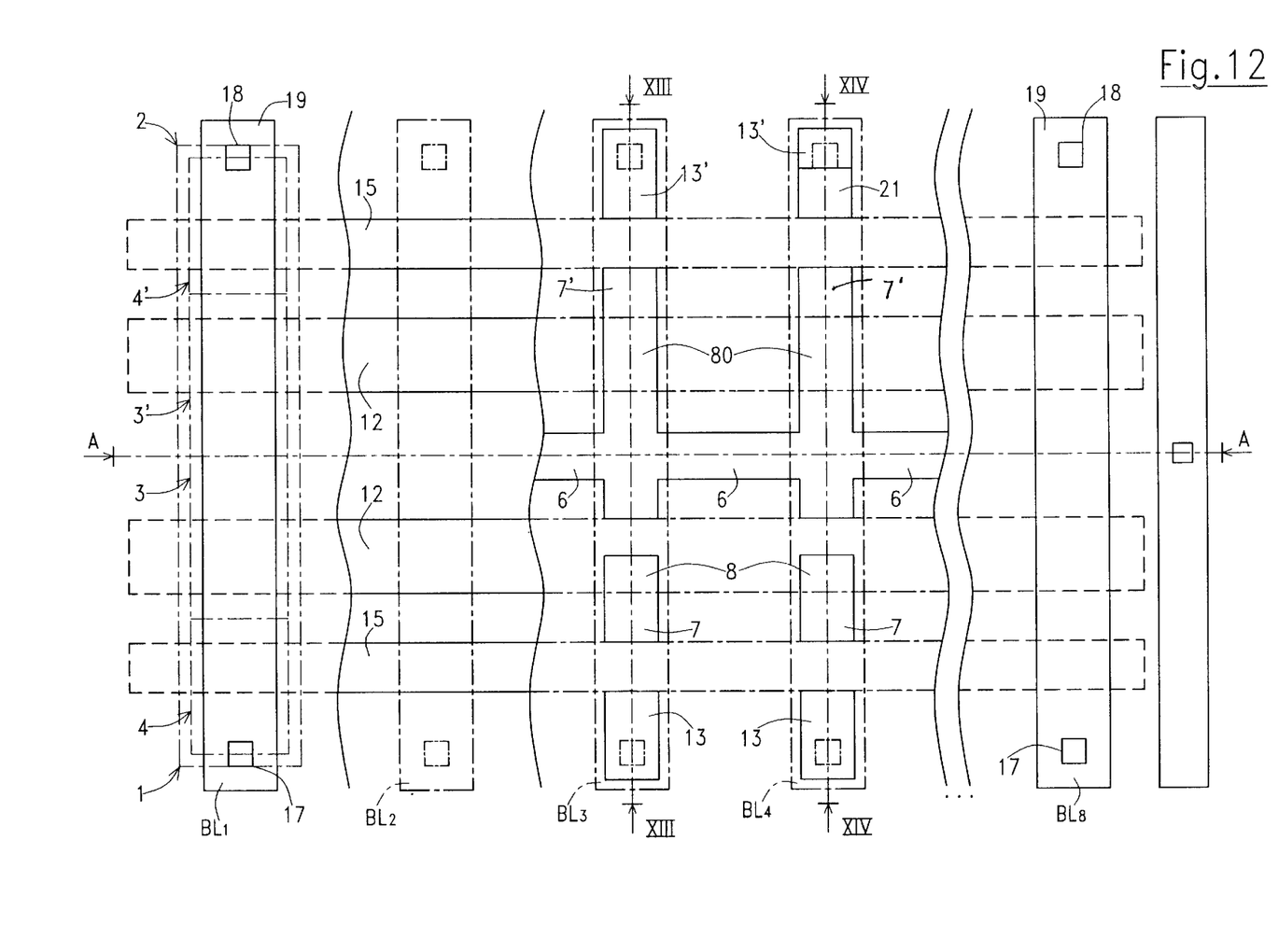
FIG. 12, referring to a fourth embodiment of the present invention, is a top-plan view of a portion of a memory array comprising again EEPROM memory cells and ROM memory cells.
Figure 13:
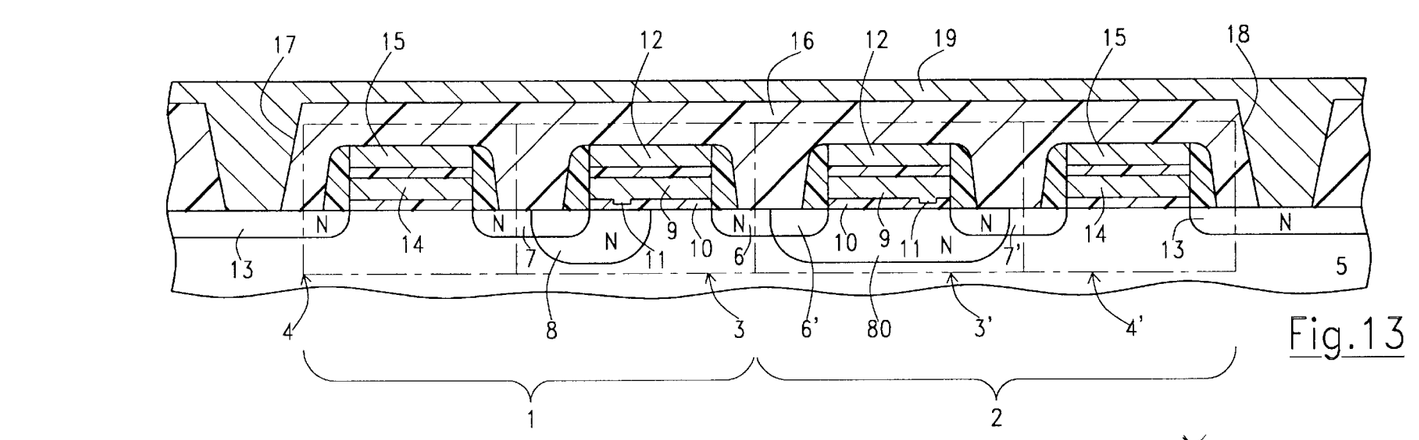
FIG. 13 is a sectional view along line XIII—XIII in FIG. 12.
Figure 14:
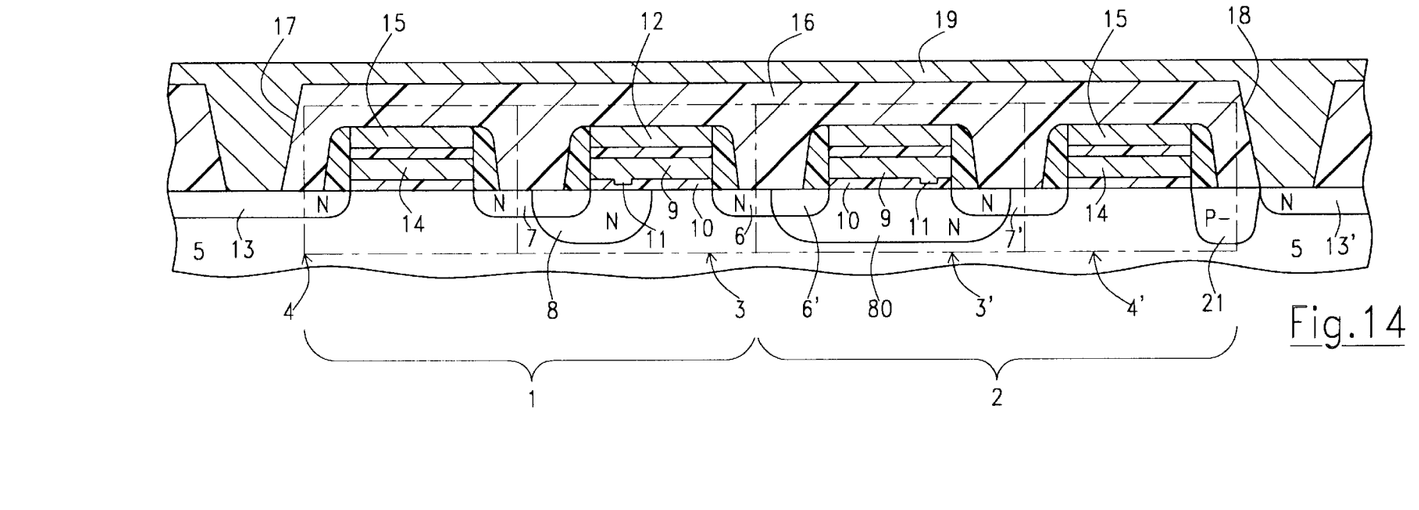
FIG. 14 is a sectional view along line XIV—XIV in FIG. 12.
Figure 15:
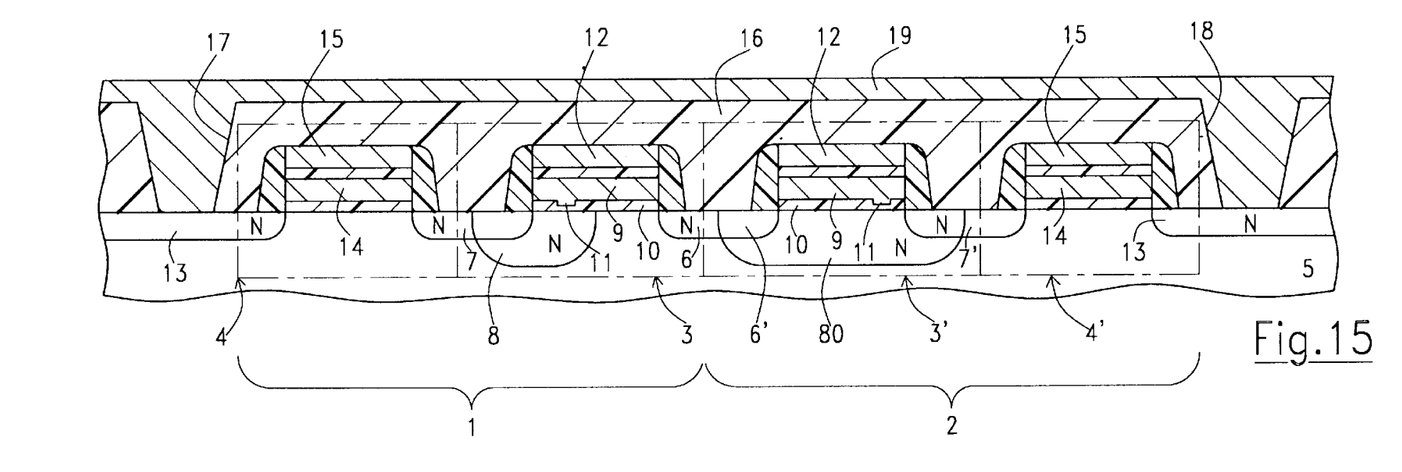
FIGS. 15 and 16 show sectional views similar to those shown in FIGS. 13 and 14, referring to an alternative embodiment of the fourth embodiment of the invention.
Figure 16:
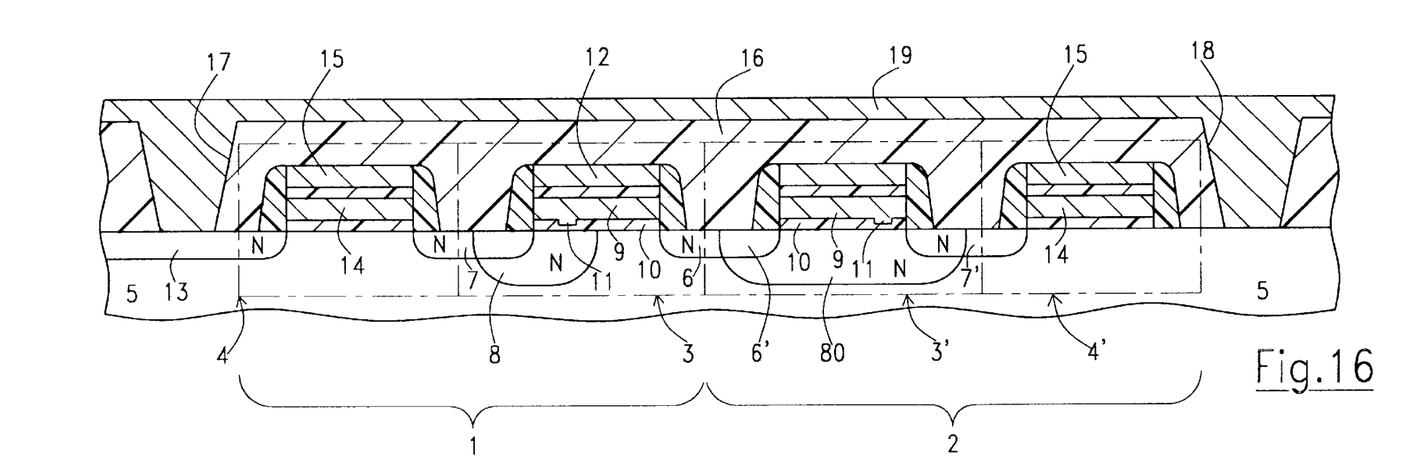

Another embodiment of the present invention is shown in FIGS. 12–14.

As in the previous embodiment, both the contact with a respective bit line, through a respective opening 18 in the dielectric layer 16, and the short-circuit between source 6' and drain 7' through a respective region 80 are always provided for each ROM cell 2.

Storing the "0" state in a ROM cell 2 is achieved by means of an implant of a P-type dopant for forming a P–region 21 located in a portion of the drain 13 of the selection transistor 4'.

Also in this embodiment, region 21 forms an electrical separation region between the selection transistor 4' and the bit line of the ROM cell 2, so that during reading of the ROM cell 2 no current will flow in the latter, the ROM cell 2 being thus non-conductive.

Similarly to the previous embodiment, as shown in FIGS. 13 and 14, the separation region 21 can be substituted by a portion of the substrate or well 5, selectively preventing the implant used for forming the drain region 13' of the selection transistor 4', at least to the opening 18.

The separation regions 20 and 21 can also be provided simultaneously in the same ROM cell; the result is always the programming of a "0" state. The same holds true for the absence of the N-type LDD implants that form the drain and source of the selection transistor 4'.

It is also possible to combine the previous embodiments, so that the identification of the stored code is made more difficult.

The lower gate electrode of the stacked-gate MOSFETs 3' of the ROM cells can be electrically floating, just as the lower gate electrode 9 of the stacked-gate MOSFETs 3 of the EEPROM memory cells. Alternatively, the lower gate electrode of the stacked-gate MOSFETs 3' can be short-circuited to the upper gate electrode thereof. The short-circuit can be provided outside the area of the memory cell array; in this case the lower gate electrodes of all the stacked-gate MOS-FETs 3' of a same row are not separated, but form instead a continuous stripe. Otherwise, the short-circuit can be obtained directly in each memory cell; in this case, the lower gate electrodes of all the stacked-gate MOSFETs 3' are separated from each other, just as they are in the EEPROM memory cells.

In the present description reference has been made to ROM memory cells integrated in an array of double-polysilicon-level EEPROM memory cells; however it is straightforward to realize that it is possible to integrate ROM memory cells in arrays of single-polysilicon-level EEPROM memory cells. Additionally, the present invention can straightforwardly apply to the integration of ROM memory cells in arrays of EPROM or Flash-EEPROM memory cells, forming the ROM cells by means of the same process steps used for fabricating the EPROM or Flash-EEPROM memory cells.

Figure 17:
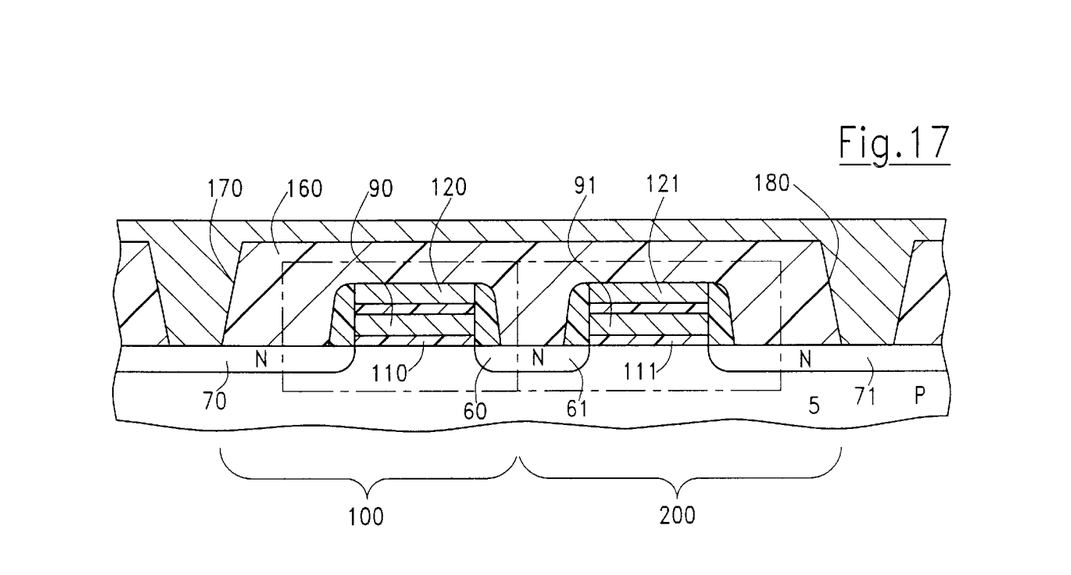
FIGS. 17 and 18 show sectional views similar to those shown in FIGS. 2 and 3, referring to an alternative embodiment of the first embodiment of the invention, comprising Flash EEPROM memory cells and ROM memory cells.
Figure 18:
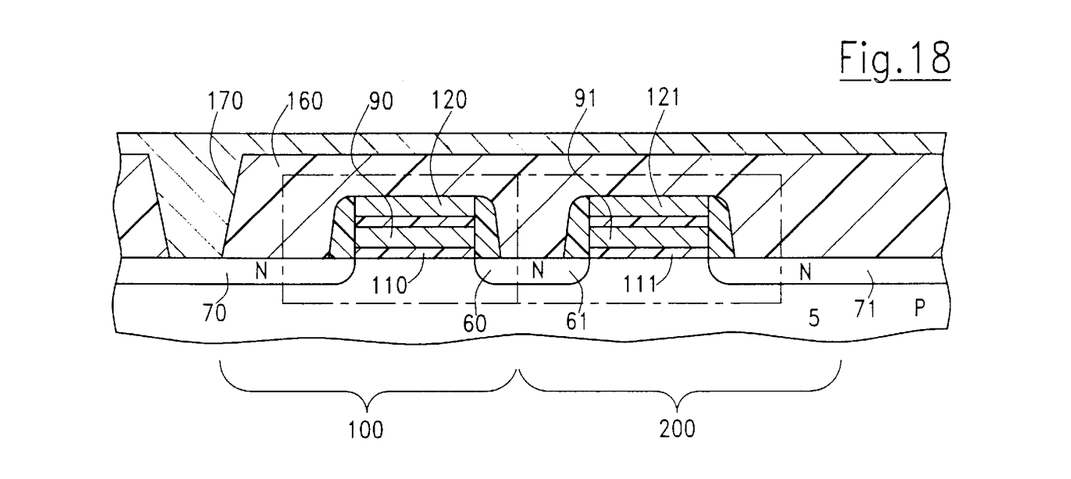

For example, FIGS. 17 and 18 show an alternative of the first embodiment previously described, referring to an array of Flash-EEPROM memory cells 100 with ROM memory cells 200 having the same structure as the Flash-EEPROM cells 100. Each Flash-EEPROM cell 100 comprises a stacked-gate MOSFET, wherein in a P-type substrate or well 5 spaced-apart N-type source and drain regions 60, 70 are implanted. The portion of substrate or well 5 comprised between regions 60 and 70 forms a channel region, and a lower gate electrode 90 is disposed above the channel region, with the interposition of a gate oxide layer 110.

An upper control gate electrode 120 is insulatively disposed over the lower gate electrode 90, which is electrically floating.

Each ROM memory cell 200 comprises, identically to the Flash-EEPROM cells 100, a stacked-gate MOSFET comprising a source region 61 separated from a drain region 71 by a channel region, and a lower gate electrode 91 disposed over the channel region with the interposition of a gate oxide layer 111.

An upper control gate electrode 121 is disposed above the lower gate electrode 91. Over the whole surface of the memory array a dielectric layer 160 is successively formed, wherein openings 170 in correspondence of the drains 70 of the Flash-EEPROM cells 100 are formed.

Similarly to the first embodiment previously described, if it is desired to program in the ROM cell 200 a "1" logic state, in the dielectric layer 160 further openings 180 are formed in correspondence of the drains 71 of the ROM cells 200 (FIG. 17). If instead it is desired to program a "0" state as shown in FIG. 18, no openings 180 are formed.

If similarly to the Flash EEPROM cells the lower gate electrode 91 of the ROM cells is electrically floating, then in order to prevent the ROM memory cells 200 which have to store a "1" state (i.e., those for which the contact 180 with a respective bit line is provided) from becoming permanently conductive even when not addressed due to trapping of positive charges in the floating lower gate electrode 91, a situation that could take place due to the electrical erasure of the array of Flash-EEPROM cells 100 (electrical erasure is a bulk operation affecting all the cells of the array) and that would cause a constant current flow through the bit line preventing the correct reading of the other memory cells connected to the bit line, it is preferred to form the gate oxide 111 of the ROM cell 200 thicker than that of the gate oxide 110 of the memory cell 100. For example, the gate oxide 111 of the ROM cell 200 can be made 200 Angstroms thick, while the gate oxide 110 of the Flash-EEPROM cell 100 approximately 100 Angstroms thick.

Another possibility is to control the voltages applied to the ROM cell during erasure of the Flash-EEPROM cells; in this case it is not necessary to form gate oxides with different thickness for the Flash-EEPROM cells and the ROM cells.

As known, one technique for electrically erasing the flash-EEPROM cells 100 provides for bringing the voltage of source electrodes 60 to approximately 12V, while keeping the control gates (word lines) at ground; another technique provides for biasing the source electrodes at approximately 4V and bringing the control gates to approximately −8V. For preventing the ROM cells 200 form achieving a negative threshold voltage, it sufficient that the control gates (word lines) of the ROM cells are kept at a voltage lower than 12V, or alternatively that the control gates are kept at ground, so that the electric field in the gate oxide is sufficiently low not to trigger the tunnel effect.

A third possibility provides for electrically short-circuiting the two polysilicon electrodes 91, 121 formed by lines in the first and second polysilicon levels, for example in a region external to the array of memory cells. In this way the lower gate electrode 91 of the ROM cells in not left floating, but is electrically short-circuited to the upper gate electrode 90.

These solutions assure that the ROM cells 200 do not become depletion MOS transistors.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Array of electrically programmable non-volatile memory cells, each cell comprising a stacked-gate MOS transistor having a lower gate electrode, an upper gate electrode coupled to a row of the array, a first electrode associated with a column of the array and a second electrode separated from the first electrode by a channel region underlying said lower gate electrode, the first electrode, the second electrode and the channel region being formed in a layer of semiconductor material of a first conductivity type and having a second conductivity type, at least one ROM memory cell which identically to the electrically programmable non-volatile memory cells comprises a stacked-gate MOS transistor and is associated with a respective row and a respective column of the array, the ROM cell comprising means for allowing or not allowing the electrical separation between said respective column and the second electrode of the ROM cell, if the ROM cell must store a first logic state or, respectively, a second logic state.

2. Array according to claim 1, wherein said means comprises a semiconductor region doped of the second conductivity type formed in the channel region of the ROM cell coupled between and for short-circuiting the first electrode and the second electrode of the ROM cell.

3. Array according to claim 2, wherein said means allows or not the electrical separation of the respective column from said semiconductor region respectively by means of the absence or presence of a contact region disposed over said ROM cell stacked-gate MOS transistor between said respective column and the first electrode of the ROM cell.

4. Array according to claim 2, wherein said means comprises a contact between said respective column and the first electrode of the ROM cell, and allow or do not allow the electrical separation between said respective column and said semiconductor region respectively by means of the presence or absence of a second semiconductor region doped of the first conductivity type interposed between said contact and said semiconductor region.

5. Array according to claim 4, wherein said second semiconductor region is a portion of said semiconductor material layer.

6. Array according to claim 1, wherein said means comprises a contact between said respective column and the first electrode of the ROM cell and allows or does not allow the electrical separation between the first electrode and the second electrode of the ROM cell respectively by means of the absence or the presence of a semiconductor region doped of the second conductivity type formed in the channel region of the ROM cell for short-circuiting the first electrode and the second electrode of the ROM cell.

7. Array according to claim 1, wherein said means allows or does not allow the electrical separation between said respective column and the second electrode of the ROM cell by means of the absence or respectively the presence of a contact between the respective column and the first electrode of the ROM cell.

8. Array according to claim 1, wherein said electrically programmable non-volatile memory cells are EEPROM memory cells, comprising each a stacked-gate MOS transistor having a source electrode formed by said second electrode, and a selection transistor having a source electrode connected to a drain electrode of the floating-gate MOS transistor, a drain electrode connected to a column of the array, and said ROM cell identically comprises a stacked-gate MOS transistor and a selection transistor.

9. Array according to claim 8, wherein the lower gate electrode of the stacked-gate MOS transistor of the EEPROM memory cells is electrically floating.

10. Array according to claim 9, wherein the lower gate electrode of the stacked-gate MOS transistor of the ROM cell is electrically short-circuited to the upper gate electrode thereof.

11. Array according to claim 8, wherein said second semiconductor region doped of the first conductivity type is formed at a source region of a selection transistor of the ROM cell.

12. Array according to claim 8, wherein said second semiconductor region doped of the first conductivity type is formed at a drain region of a selection transistor of the ROM cell.

13. Array according to claim 1, wherein said electrically programmable non-volatile memory cells are EPROM cells each one formed by a stacked-gate MOS transistor having a drain electrode formed by said first electrode and a source electrode formed by said second electrode, and the ROM cell is identically formed by a stacked-gate MOS transistor.

14. Array according to claim 13, wherein the lower gate electrode of the stacked-gate MOS transistors forming the EPROM cells is electrically floating.

15. Array according to claim 14, wherein the lower gate electrode of the stacked-gate MOS transistor forming the ROM cell is electrically short-circuited to the upper gate electrode thereof.

16. Array according to claim 1, wherein said electrically programmable non-volatile memory cells are Flash-EEPROM memory cells each one formed by a stacked-gate MOS transistor having a drain electrode formed by said first electrode and a source electrode formed by said second electrode, and said ROM cell is identically formed by a stacked-gate MOS transistor.

17. Array according to claim 16, wherein the lower gate electrode of the stacked-gate MOS transistors forming the Flash EEPROM memory cells is electrically floating.

18. Array according to claim 17, wherein said ROM memory cells have a gate oxide thicker than a gate oxide of said Flash-EEPROM memory cells.

19. Array according to claim 17, wherein said ROM memory cells during the erase operation of the Flash-EEPROM memory cells are biased in such a way as the electric field in the gate oxide is sufficiently low not to trigger the tunnel effect.

20. Array according to claim 17, wherein the lower gate electrode and the upper gate electrode of the stacked-gate MOS transistor forming said ROM memory cells belongs to respective lines formed by means of a first and a second level of polysilicon, said electrodes being electrically short-circuited.

21. An array of memory cells comprising: at least one electrically programmable non-volatile memory cell; and at least one ROM memory cell; said at least one electrically programmable non-volatile memory cell comprising a stacked-gate MOS transistor having a lower gate electrode and an upper gate electrode coupled to a row of the array, a first electrode associated with a column of the array and a second electrode separated from the first electrode by a channel region underlying said lower gate electrode, said first electrode, second electrode and channel region being formed in a layer of semiconductor material of a first conductivity type; said at least one ROM memory cell comprising a stacked-gate MOS transistor, a first electrode, a second electrode and means for one of allowing and disallowing the electrical separation between said respective column and the second electrode of the ROM memory cell, whereby the ROM memory cell stores a first logic state or, respectively, a second logic state.

22. An array according to claim 21 wherein said means for allowing and disallowing comprises a doped semiconductor region of second conductivity type formed in the channel region of the ROM cell coupled between and for short-circuiting the first electrode and the second electrode of the ROM cell.

23. An array according to claim 22 wherein said means for allowing and disallowing does so by means of the absence or presence of a contact region disposed over said ROM cell stacked-gate MOS transistor between said respective column and the first electrode of the ROM cell.

24. An array according to claim 22 wherein said means for allowing and disallowing comprises a contact between said respective column and the first electrode of the ROM cell, and allowing or not allowing the electrical separation between the respective column and said semiconductor region, respectively, by means of the presence or absence of a second semiconductor region doped of the first conductivity type and interposed between said contact and said semiconductor region.

25. Array according to claim 24, wherein said second semiconductor region is a portion of said semiconductor material layer.

26. Array according to claim 21, wherein said means for allowing and disallowing comprises a contact between said respective column and the first electrode of the ROM cell and allows or does not allow the electrical separation between the first electrode and the second electrode of the ROM cell respectively by means of the absence or the presence of a semiconductor region doped of the second conductivity type formed in the channel region of the ROM cell for short-circuiting the first electrode and the second electrode of the ROM cell.

27. Array according to claim 21, wherein said means for allowing and disallowing allows or does not allow the electrical separation between said respective column and the second electrode of the ROM cell by means of the absence or respectively the presence of a contact between the respective column and the first electrode of the ROM cell.

28. Array according to claim 21, wherein said electrically programmable non-volatile memory cells are EEPROM memory cells, comprising each a stacked-gate MOS transistor having a source electrode formed by said second electrode, and a selection transistor having a source electrode connected to a drain electrode of the floating-gate MOS transistor, a drain electrode connected to a column of the array, and said ROM cell identically comprises a stacked-gate MOS transistor and a selection transistor.

29. Array according to claim 28, wherein the lower gate electrode of the stacked-gate MOS transistor of the EEPROM memory cells is electrically floating.

30. Array according to claim 29, wherein the lower gate electrode of the stacked-gate MOS transistor of the ROM cell is electrically short-circuited to the upper gate electrode thereof.

31. Array according to claim 28, wherein said second semiconductor region doped of the first conductivity type is formed at a source region of a selection transistor of the ROM cell.

32. Array according to claim 28, wherein said second semiconductor region doped of the first conductivity type is formed at a drain region of a selection transistor of the ROM cell.

33. Array according to claim 21, wherein said electrically programmable non-volatile memory cells are EPROM cells each one formed by a stacked-gate MOS transistor having a drain electrode formed by said first electrode and a source electrode formed by said second electrode, and the ROM cell is identically formed by a stacked-gate MOS transistor.

34. Array according to claim 33, wherein the lower gate electrode of the stacked-gate MOS transistors forming the EPROM cells is electrically floating.

35. Array according to claim 34, wherein the lower gate electrode of the stacked-gate MOS transistor forming the ROM cell is electrically short-circuited to the upper gate electrode thereof.

36. Array according to claim 21, wherein said electrically programmable non-volatile memory cells are Flash-EEPROM memory cells each one formed by a stacked-gate MOS transistor having a drain electrode formed by said first electrode and a source electrode formed by said second electrode, and said ROM cell is identically formed by a stacked-gate MOS transistor.

37. Array according to claim 36, wherein the lower gate electrode of the stacked-gate MOS transistors forming the Flash EEPROM memory cells is electrically floating.

38. Array according to claim 37, wherein said ROM memory cells have a gate oxide thicker than a gate oxide of said Flash-EEPROM memory cells.

39. Array according to claim 37, wherein said ROM memory cells during the erase operation of the Flash-EEPROM memory cells are biased in such a way as the electric field in the gate oxide is sufficiently low not to trigger the tunnel effect.

40. Array according to claim 37, wherein the lower gate electrode and the upper gate electrode of the stacked-gate MOS transistor forming said ROM memory cells belongs to respective lines formed by means of a first and a second level of polysilicon, said electrodes being electrically short-circuited.

41. An array of memory cells comprising: at least one electrically programmable non-volatile memory cell; and at least one ROM memory cell; said at least one electrically programmable non-volatile memory cell comprising a stacked-gate MOS transistor having a lower gate electrode and an upper gate electrode coupled to a row of the array, a first electrode associated with a column of the array and a second electrode separated from the first electrode by a channel region underlying said lower gate electrode, said first electrode, second electrode and channel region being formed in a layer of semiconductor material of a first conductivity type; said at least one ROM memory cell comprising a stacked-gate MOS transistor, a first electrode, a second electrode separated from said first electrode by a channel region underlying said stacked stacked-gate MOS transistor, and a doped semiconductor region of second conductivity type formed in the channel region of the ROM cell coupled between and for short-circuiting the first electrode and the second electrode of the ROM cell.

42. An array according to claim 41, wherein the stacked-gate MOS transistors associated with both the electrically programmable non-volatile memory cell and the ROM memory cell are of substantially identical construction.

43. An array according to claim 41, further including a contact region disposed over said ROM cell stacked-gate MOS transistor and disposed between said respective column and the first electrode of the ROM cell.

* * * * *